(12) United States Patent
Van Den Bosch

(10) Patent No.: US 7,840,859 B2
(45) Date of Patent: Nov. 23, 2010

(54) BLOCK INTERLEAVING WITH MEMORY TABLE OF REDUCED SIZE

(75) Inventor: Bram Van Den Bosch, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 747 days.

(21) Appl. No.: 11/815,883

(22) PCT Filed: Feb. 3, 2006

(86) PCT No.: PCT/IB2006/050365

§ 371 (c)(1),
(2), (4) Date: Aug. 9, 2007

(87) PCT Pub. No.: WO2006/085251

PCT Pub. Date: Aug. 17, 2006

(65) Prior Publication Data

US 2008/0270714 A1    Oct. 30, 2008

(30) Foreign Application Priority Data

Feb. 14, 2005    (EP) .................................. 05101058

(51) Int. Cl.
*G06F 11/00*    (2006.01)

(52) U.S. Cl. .................. 714/701; 714/50; 714/755; 714/723; 714/702; 714/746; 714/756; 369/53.1; 375/377; 711/105; 711/2; 711/202; 711/211; 341/81; 370/312

(58) Field of Classification Search .................. None
See application file for complete search history.

(56) References Cited

U.S. PATENT DOCUMENTS

| | | | | |
|---|---|---|---|---|
| 3,335,409 A | * | 8/1967 | Heller et al. ................ | 375/296 |
| 4,394,642 A | * | 7/1983 | Currie et al. ................ | 341/81 |
| 5,530,934 A | * | 6/1996 | Hilton ......................... | 711/5 |
| 5,537,420 A | * | 7/1996 | Huang ........................ | 714/701 |
| 5,946,357 A | * | 8/1999 | Sandin et al. ............... | 375/296 |
| 6,061,760 A | | 5/2000 | Huang | |
| 6,088,760 A | | 7/2000 | Walker et al. | |

(Continued)

FOREIGN PATENT DOCUMENTS

EP    0681373 A2    11/1995

OTHER PUBLICATIONS

"Universal Mobile Telecommunications System" (UMTS), Multiplexing and Channel Coding Version 6.0.0 Release 6), ETSI Standards, European Telecommunications Standards Institute, Sophia-Antipo, FR, vol. 3-R1, No. V600, Dec. 2003, XP014016689.

*Primary Examiner*—John P Trimmings

(57) ABSTRACT

Interleaving improves noise rejection in digital communication and storage systems. According a known scheme, the interleaving/deinterleaving is achieved by storing symbols in a temporary memory table of R rows×C columns in a row by row order, and reading them in a column by column order, or vice versa, so obtaining a rearranged order. Methods and devices for interleaving and deinterleaving are proposed which accomplish the same interleaving/deinterleaving operation with a reduced size of the temporary memory table. The rearrangement of the symbols according to the rearranged order is accomplished by using a table with a reduced memory size, in combination with the order with which the symbols are fetched from or stored in a further memory. The invention further relates to ICs and apparatuses for interleaving and/or deinterleaving.

16 Claims, 15 Drawing Sheets

U.S. PATENT DOCUMENTS

| | | |
|---|---|---|
| 6,205,104 B1 | 3/2001 | Nagashima et al. |
| 6,701,467 B1* | 3/2004 | Victor ........................ 714/701 |
| 7,386,766 B2* | 6/2008 | Gao et al. .................... 714/702 |
| 2002/0044767 A1* | 4/2002 | Kwak ......................... 386/114 |
| 2002/0075715 A1* | 6/2002 | Kwon .......................... 365/51 |
| 2003/0014700 A1* | 1/2003 | Giulietti et al. ............. 714/701 |
| 2004/0190414 A1* | 9/2004 | Iwata et al. ................. 369/53.1 |
| 2005/0248473 A1* | 11/2005 | Kukla et al. ................... 341/50 |

* cited by examiner

BLOCK INTERLEAVING WITH MEMORY TABLE OF REDUCED SIZE

The invention relates to a method of deinterleaving, and to a corresponding method of interleaving.

The invention further relates to a deinterleaver and to a corresponding interleaver.

Interleaving is used in some digital communication systems to improve the robustness of the communication. Several schemes of interleaving and deinterleaving, which is the inverse operation of interleaving, are known: for example the so-called block interleaving, according to which a sequence of symbols to be transmitted is divided into blocks, and for each block the symbols belonging to that block are shuffled within that block prior to transmission. For example, according to a particular block interleaving scheme a table of R rows and C columns is used, wherein each element of the table or cell can contain one symbol: the symbols of each bock, which is a blocks of R×C symbol, are shuffled by storing them in the table on a row by row order and read out on a column by column order, or vice versa. The symbols can be for example bit strings of a fixed length.

This scheme of block interleaving can be formally expressed as follows: reordering a block of R×C symbols where each symbol initially has a position index i, so that the each symbol takes a new position index j, where $j=c\times R+r$, with $r=i$ DIV C and $c=i$ MOD C.

A variant of this scheme of block interleaving is used for example in Blu-ray Disc (BD) systems, according to which a block, called ECC cluster, of 248 rows and 304 columns is used. As it appears clear from the foregoing discussion, the operation of interleaving/deinterleaving can be carried out by using a memory in the form of a table of 248 rows and 304 columns.

In the operation of deinterleaving in particular, bytes of an ECC block retrieved from a disc are initially stored in the table in a row by row order; subsequently, the bytes stored in the table are read out in a column by column order, and stored, in the same order in which they are read, in a different memory, often referred to as a buffer memory. This buffer memory typically has a rather large size, for example in the order of some Mbytes, and is usually consisting of SDRAM memory type. The buffer memory serves as an interface between a device for accessing a BD, often referred to as drive, and a host device such as a Personal Computer.

This table of R rows×C columns bytes needs to be suitable for a fully random access, since the order in which elements of the table are written is different from the order in which said elements of the table are read, e.g. row by row vs. column by column. This consideration points to the use of SRAM memory, where each byte can be individually addressed.

A major drawback of the use of SRAM for the table however is that this type of memory is space consuming and, for the required amount of memory, that is 248×304 bytes, leads to a remarkable area in encoder/decoder IC allocated only for the table.

It is an object of the invention to provide a method of deinterleaving and a corresponding method of interleaving symbols belonging to a block of symbols allowing for the use of a table with a reduced capacity space.

It is a further object of the invention to provide a deinterleaver and a corresponding interleaver wherein a table with a reduced capacity space is used.

According to the invention, the first object is achieved by a method of deinterleaving as claimed in claim 1 and by a corresponding method of interleaving as claimed in claim 6.

The deinterleaving of the symbols belonging to the block of R×C symbols is effected without the use of a table of R rows and C columns, but instead with a smaller table of N rows and C columns.

In claim 1, the rearrangement of the symbols according to the rearranged order is accomplished in the buffer memory due to the combination of the use of the table and the order with which the symbols taken from each column of the table are stored in the buffer memory.

Similarly, in claim 6, the rearrangement of the symbols according to the rearranged order is accomplished due to the combination of the use of the table and the order with which the symbols taken from the buffer memory are stored in the columns of the table.

It is observed that the operations of interleaving and deinterleaving could in principle be accomplished without the use of any table at all. In fact, in deinterleaving for example, the symbols of the block could be individually placed in the SDRAM buffer memory directly according to the deinterleaved order. Such a deinterleaving method, which does not require any table at all, involves however a major drawback: accesses to the SDRAM buffer memory are made very slow and inefficient.

In fact, an SDRAM memory has some entries, individually addressable, consisting of a few bytes, e.g. 8 or 16 bytes, and the access to the SDRAM memory takes place with the best efficiency if entries are accessed at once. This reflects the fact the SDRAM memories are well suited for accesses where the transfer of a relatively large package of data is involved. In contrast, when amounts of bytes smaller that a single entry are written a loss in efficiency derives, which loss in efficiency is sometimes referred to as loss in bandwidth or bandwidth penalty. It is clear that the worst situation for loss in bandwidth is in place when individual bytes are accessed in a non-sequential order.

In the method according to the invention instead, accesses to the buffer memory are kept relatively efficient if compared to the known method, since symbols are written therein in groups of N and not individually.

While N can in principle be arbitrarily selected, it will appear clear that the best efficiency is achieved when N is exactly equal to M, M being the number of symbols that can be stored in each entry of the buffer memory, which is typically a power of 2. A good efficiency can be achieved also when N is selected as a sub-multiple of M, like for example M/2 or M/4, in the event that M is a power of 2. A choice of N not being M or a divider thereof is impractical because it involves a lower efficiency.

Preferably N is also a divider of R, so that the block of R×C symbols is partitioned into R/N sub-blocks of N×C symbols: in this event accesses to the buffer memory can take place according to a relatively simple scheme. However it is also possible for N not to be a divider of R, in which case the last sub-block contains less than N×C symbols, namely (R MOD N)×C, and consequently in the last iteration of the method the table is not filled completely. Clearly, in this last case, only the first R MOD N symbols of each column need to be transferred to the buffer memory; nevertheless the entire columns can be transferred provided that the last N−(R MOD N) end up in locations of the buffer memory where they do not overwrite previously stored symbols, for example because the presence of N−(R MOD N) locations for non-meaningful or dummy symbols is foreseen. If N is not to a divider of R, and no locations for dummy symbols, or holes in the memory, are foreseen, then the groups of N symbols that are fetched from the table will in some cases be stored in the buffer memory across two adjacent entries, with comparably lower efficiency.

The methods of claims 1 and 6 can be applied respectively for the deinterleaving and the interleaving according to Blu-Ray Disc. In this case the block is an ECC cluster, R is equal to 248 and C is equal to 304. N can be advantageously selected as equal to 16.

In this case the table used for the shuffling consists of 16×304 bytes instead of 248×304, therefor allowing for a reduction of more than 90% of the memory size, with consequent reductions in required area and cost.

As it will appear clear from the foregoing discussion, the further object is achieved by a device for deinterleaving or deinterleaver as claimed in claim 10, and by a corresponding device for interleaving or interleaver as claimed in claim 12.

Advantageous embodiments of the methods and devices according to the invention are claimed in the dependent claims.

These and other aspects of the methods and devices according to the invention will be further elucidated and described with reference to the drawings. In the drawings.

Figure 3:
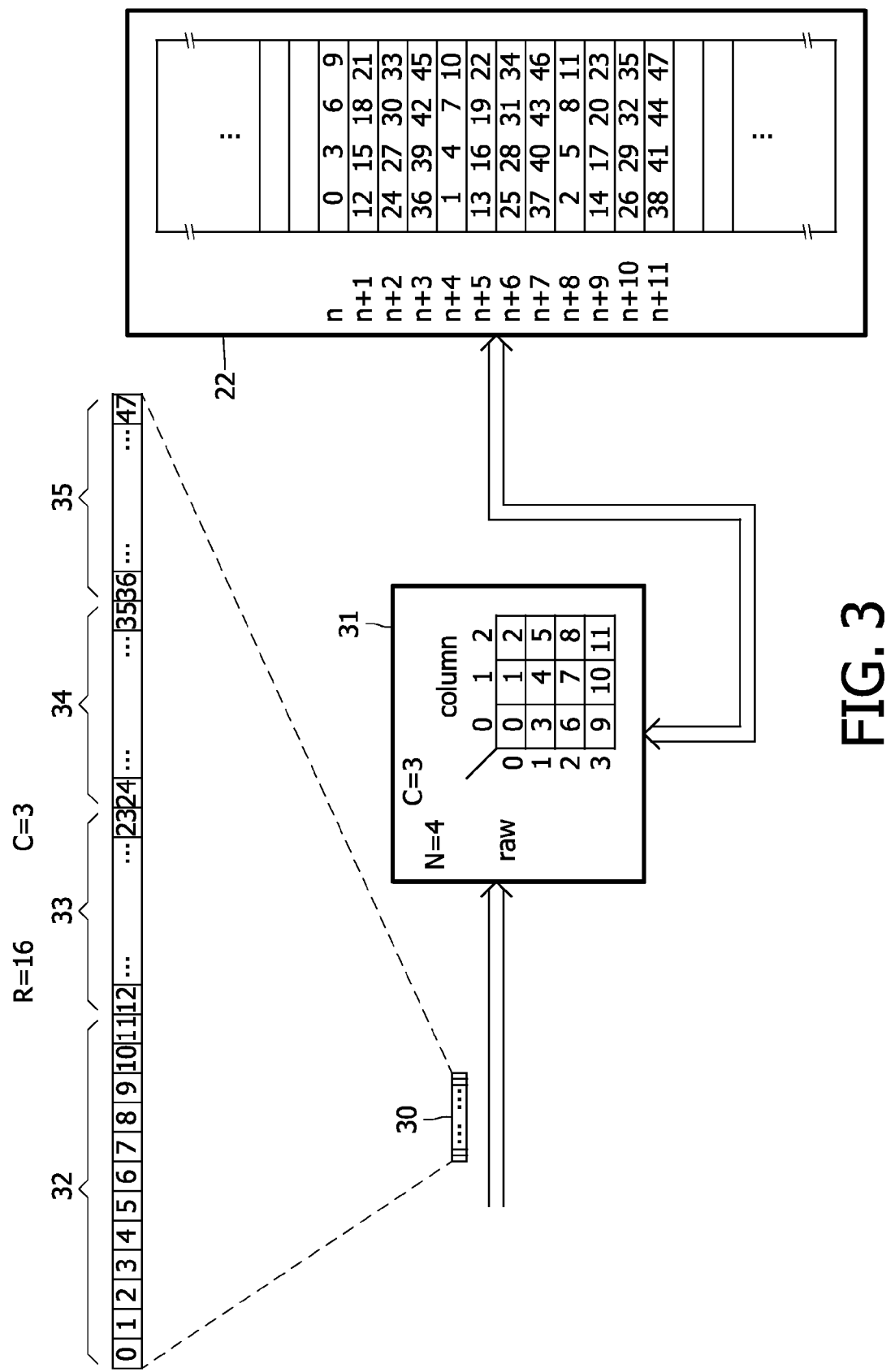
Figure 4:
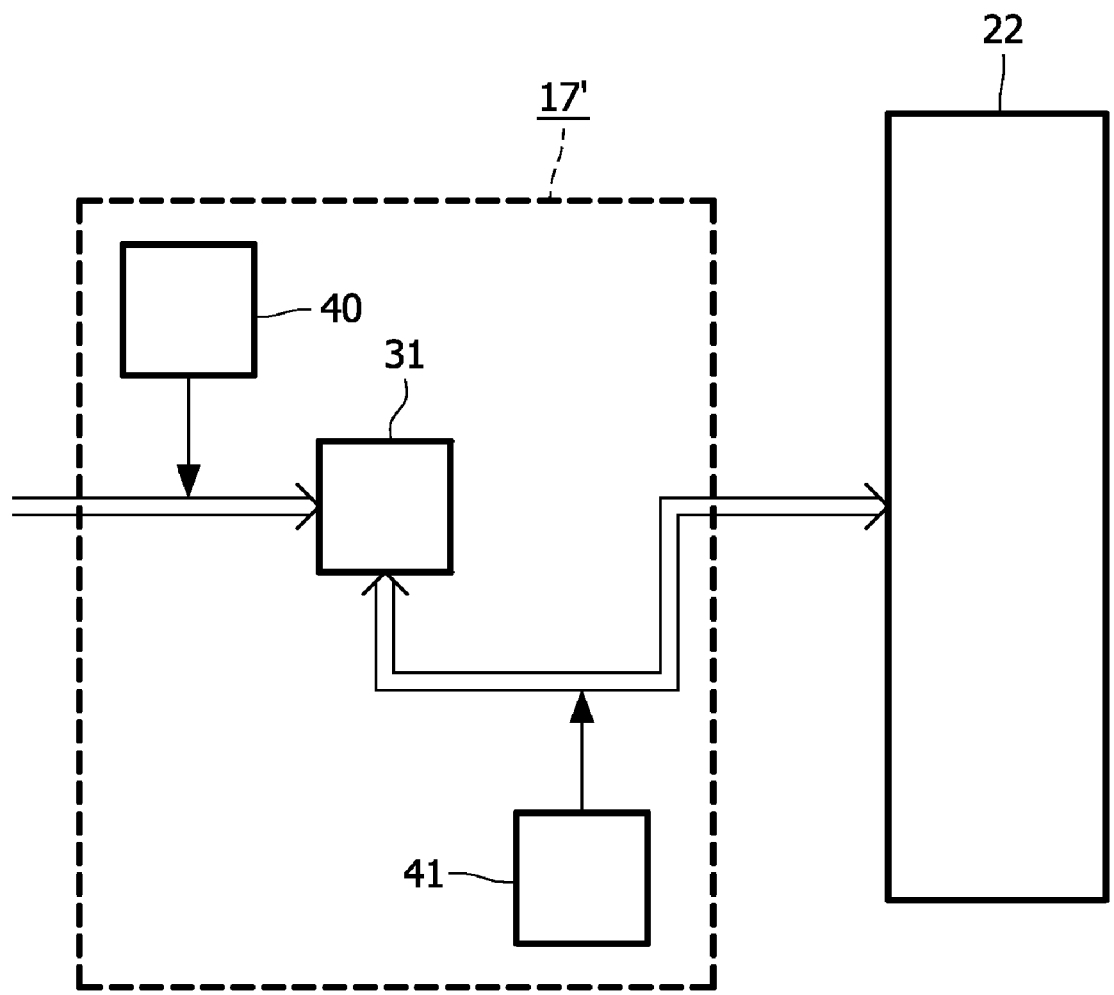
Figure 5:
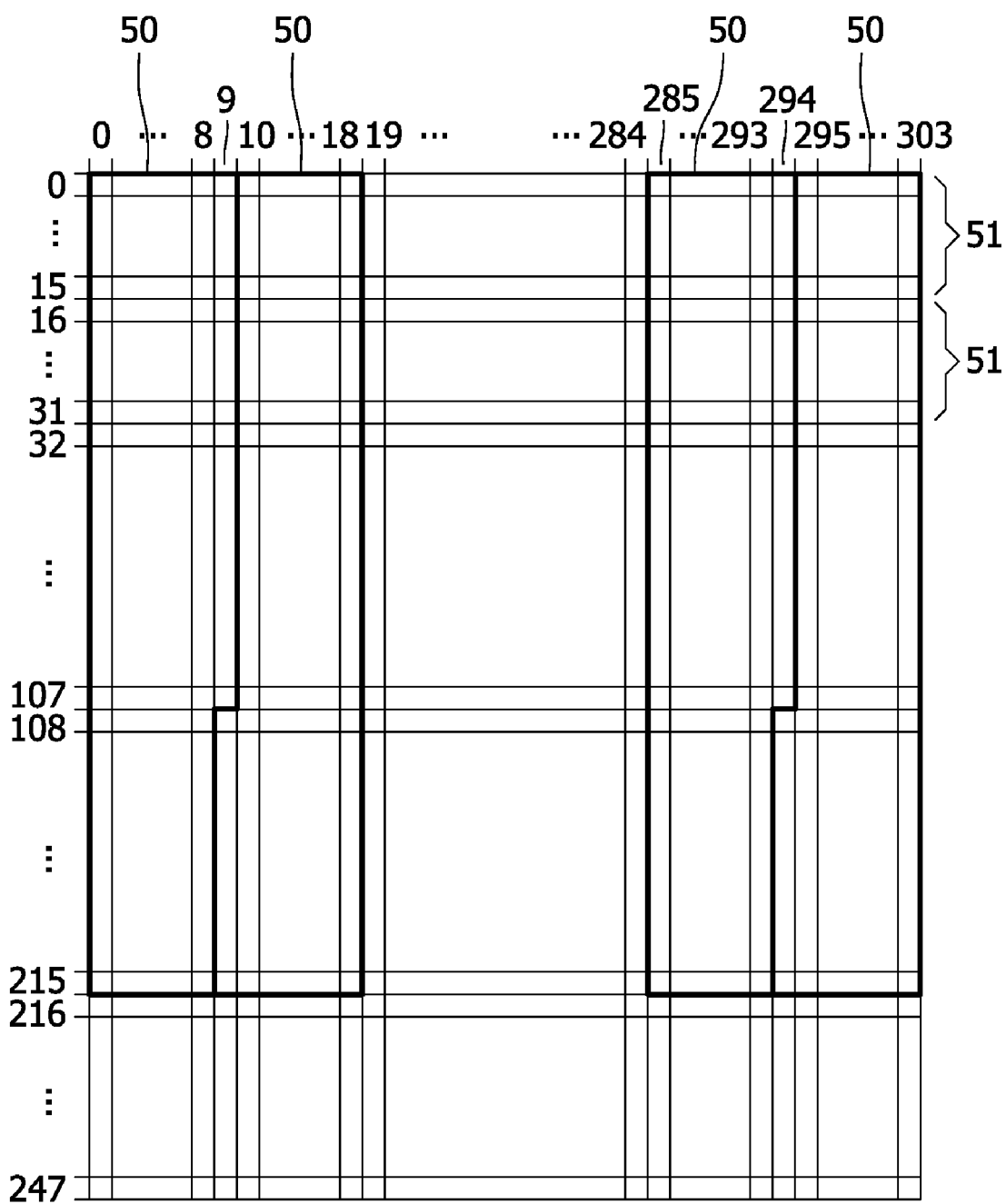
Figure 6A:
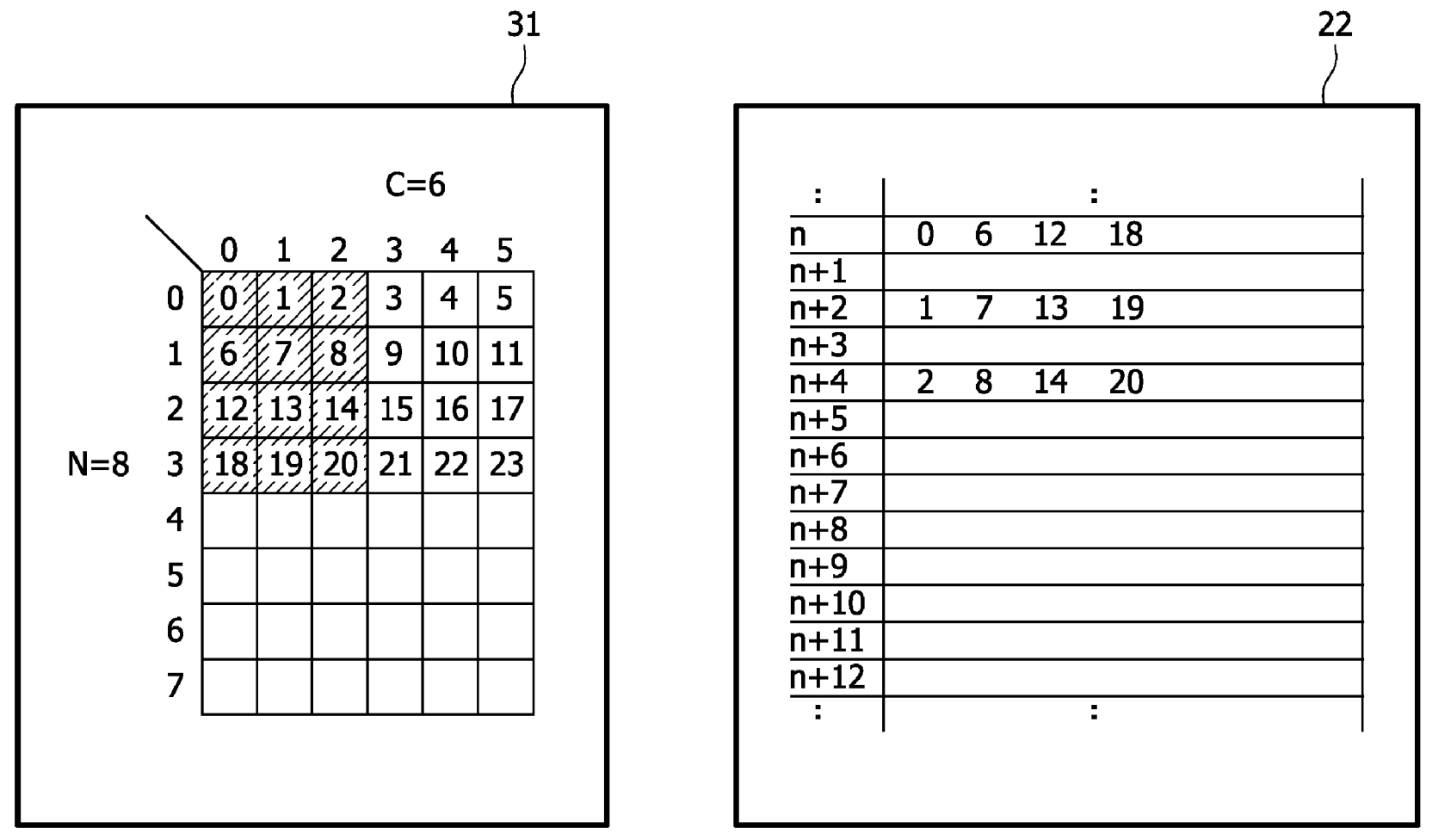
Figure 6B:
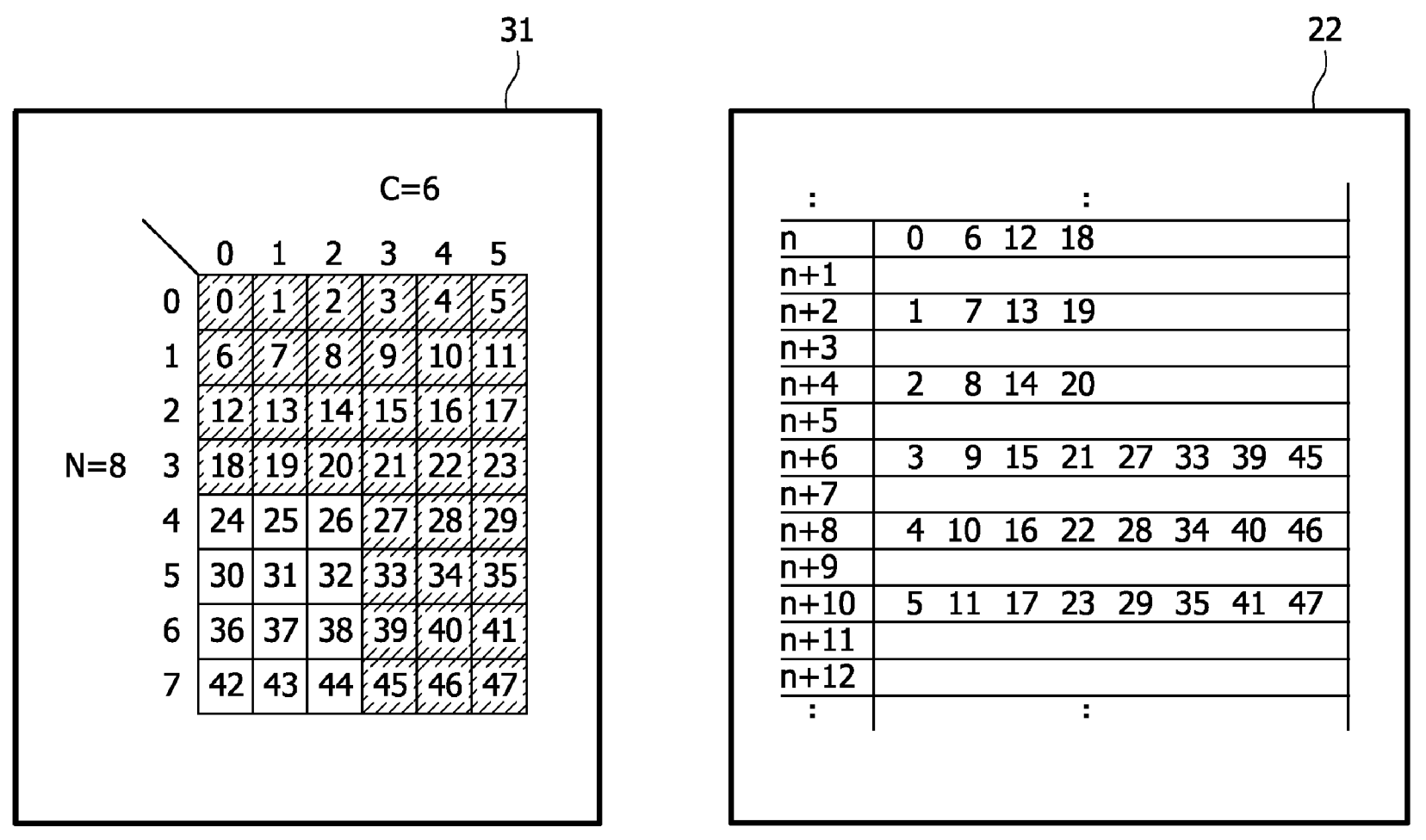
Figure 6C:
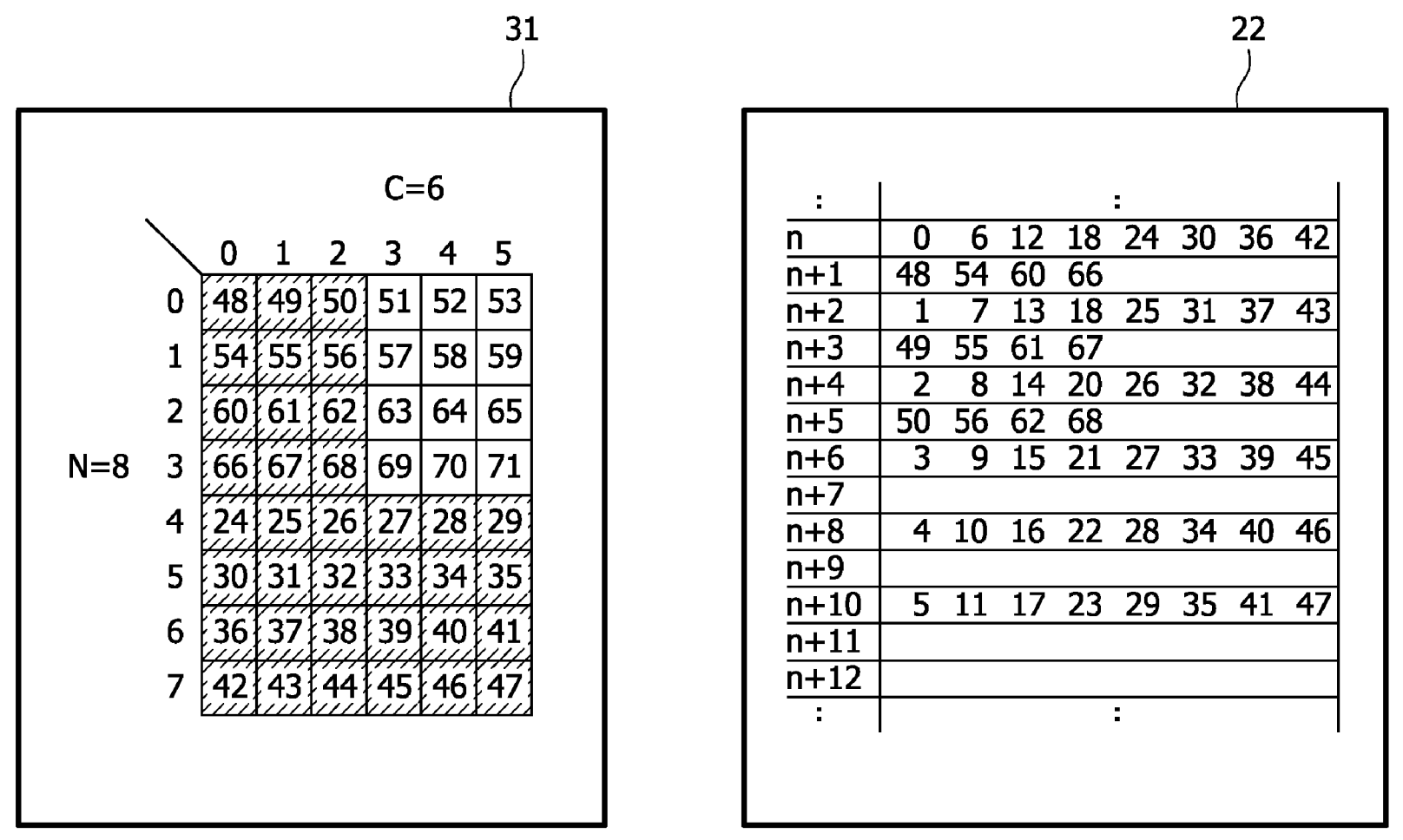
Figure 8:
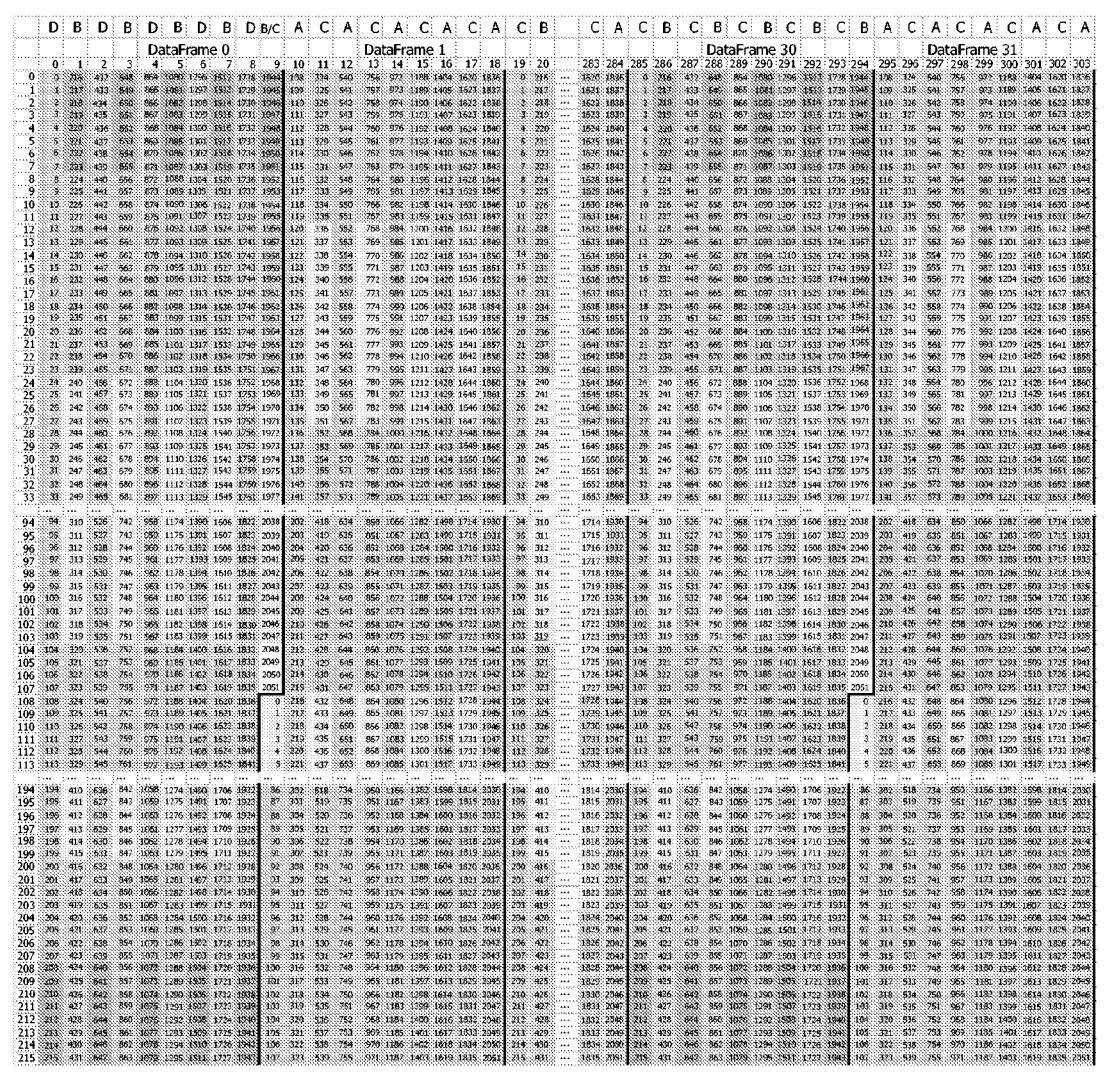

FIG. 3 shows how symbols of a block are deinterleaved in a method of deinterleaving according to the invention, FIG. 4 shows a device for deinterleaving symbols of a block according to the invention, FIG. 5 shows an ECC cluster, FIGS. 6a, 6b and 6c show how symbols of a block are deinterleaved in a further embodiment of the method of deinterleaving according to the invention, FIGS. 7a-7k show how symbols of a block are deinterleaved in a yet further embodiment of the method of deinterleaving according to the invention, FIG. 8 shows how symbols of an ECC cluster are deinterleaved according to the embodiment of the method of deinterleaving explained with reference to FIGS. 7a-7k.

Figure 1:
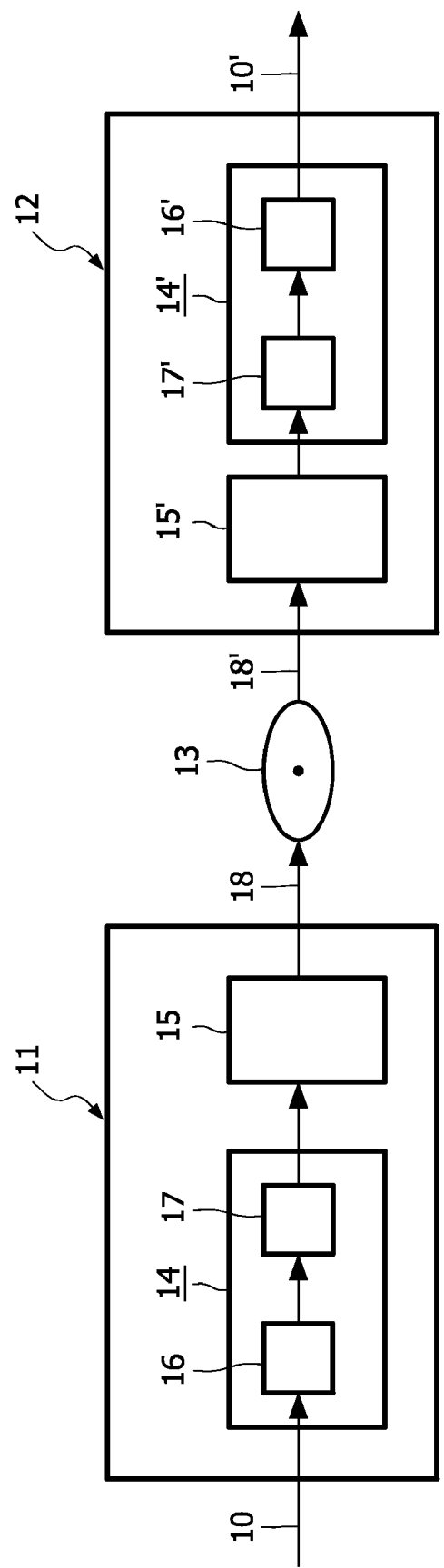
FIG. 1 shows a digital communication system.

FIG. 1 shows a digital communication system, comprising a transmitter 11, a receiver 12 and a channel, through which data 10, in the form of a sequence of symbols, are transmitted from the transmitter 11 to the receiver 12. The channel can be represented also by an information carrier 13, as shown in the Figure, as it is known from the Theory of Communications. The transmitter 11, or recorder, comprises an encoder 14, which encodes data 10 in a form so as to be less sensitive to noise, and a modulator 15, for generating an analog signal 18 upon the data encoded, which analog signal 18 is recorded on the information carrier 13 by appropriate recording means, not shown in the Figure. The receiver 12, or reader, comprises a demodulator 15' for demodulating a regenerated analog signal 18', regenerated from the information carrier 13 by appropriate read-out means, also not shown in the Figure, so as to reconstruct the data encoded, and a decoder 14', for decoding the data encoded reconstructed so as to obtain a replica of data 10'. In detail, the encoder 14 comprises an Error Correction Code (ECC) generator 16 and an interleaver 17; similarly the decoder 14' comprises a deinterleaver 17' and an error correction unit 16', for using and eventually suppressing the ECC. The interleaver 17 and the deinterleaver 17' perform inverse operations.

The ECC is some redundant information, e.g. parity bytes, which can be used by the error correction unit 16' to verify the correctness of the encoded data reconstructed, and, should any symbol be found to have been corrupted, to perform a correction if possible. The correction of corrupted symbols is possible on condition that not too many symbols close to each other are corrupted. Corruption of symbols due to white noise present in the transmission channel, i.e. a noise randomly and evenly likely to corrupt any symbol of a sequence transmitted, irrespectively one of another, can in general be remedied by use of the ECC; in contrast the ECC alone is generally not a remedy to burst errors, i.e. the corruption of a plurality of symbols adjacent in the sequence transmitted.

In systems where the channel noise has a burst-like behavior, like for example optical disc, which are susceptible of scratches and other defects, the error correction needs to be combined with interleaving/deinterleaving. The operation of interleaving changes the original order of the sequence of symbols so as to obtain that adjacent symbols according to the original order are well apart in the sequence transmitted over the channel, and vice versa, while the inverse operation of deinterleaving, which takes place at the receiver side, re-establishes the original order. In this way the symbols of a sub-sequence of symbols which might be corrupted by a burst errors during the transmission are spread apart by the deinterleaving, i.e. re-establishing the original order, allowing the usual error correction measures to be effective also in this circumstance.

For the sake of the discussion attention in focused hereinafter on the operation of deinterleaving: it will be understood however that any statement referred to the operation of deinterleaving, can be applied with due changes to the inverse operation of interleaving. Further, it will be clear to the person skilled in the art how the ECC generation and the error detection/correction will tale place, even if they are not explicitly mentioned.

Figure 2:
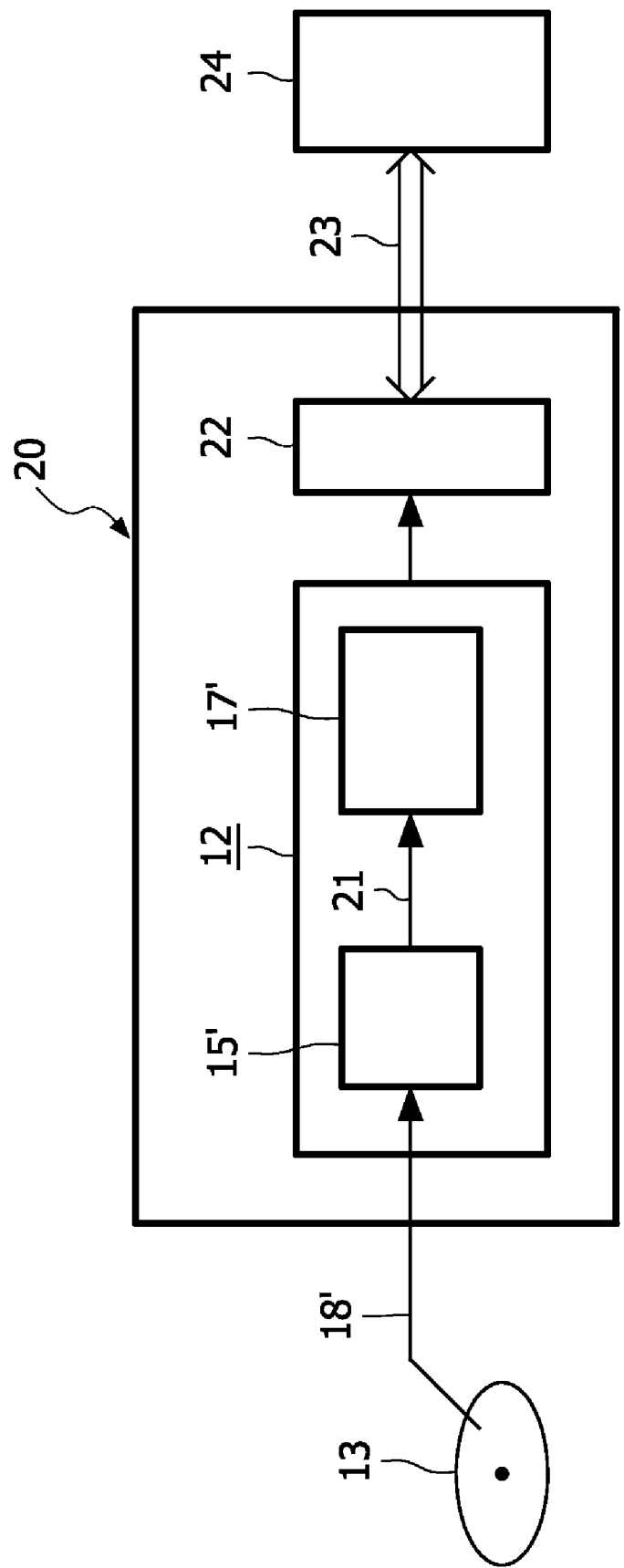
FIG. 2 shows a system for the read-out of an information carrier.

FIG. 2 shows a system for the read-out of an information carrier, comprising an accessing unit 20 and a host device 24, connected to each other by a bus 23. The accessing unit 20, often referred to as "drive", is capable of retrieving the data recorded on the information carrier 13 and storing them on a buffer memory 22, where they are available to the host device 24 for rendering. The buffer memory 22 and a receiver 12 are parts of the accessing unit 20. The host device 24 may be a PC; as an alternative the accessing unit 20 and a host device 24 may be integrated in a consumer electronic apparatus such as a disc player. The presence of the buffer memory 22 allows decoupling the retrieval of the data recorded on the information carrier 13 from the rendering. In fact the retrieval typically takes place at a relatively low but steady rate, while the rendering can advantageously take place by means of "transfer packages", i.e. periods of relatively high data transfer, interleaved by periods in which the bus 23 is idle.

In the accessing unit 20 a readout signal 18' is generated by readout means, not shown in the Figure, from the information carrier 13. This readout signal 18' is converted by the demodulator 15' into a sequence, or stream, of symbols 21, which stream of symbols 21 is fed to the deinterleaver 17'. A scheme of interleaving/deinterleaving is defined in the order of the symbols during transmission, i.e. the rearranged order, in contrast to the original order of the same symbols. According to a possible scheme of interleaving/deinterleaving, and to a known method of deinterleaving therefore, in the deinterleaver 17' blocks of R×C symbols of the stream of symbols 21 are rearranged by using a memory table of R rows and C columns. The symbols are temporarily stored in the table, in the same order as they are provided in the stream of symbols 21 produced by the demodulator 15', in a row by row order; when a whole block has been stored and the table is full, the symbols stored in the table are fetched, or read out, on a column by column order: the groups of symbols fetched in the columns are stored in the buffer memory 22 in the same order as they are read from the table.

This type of block interleaving can be formally expressed as follows: reordering a block of R×C symbols where each symbol initially has a position index i, so that the each symbol takes a new position index j, where j=c×R+r, with r=i DIV C and c=i MOD C.

After the deinterleaving has taken place the symbols are therefore present in the buffer memory 22 in the deinterleaved order, that is the original order.

Since it is in some situations impractical to suspend the flow of symbols from the modulator, such an operation of deinterleaving actually requires the alternate use of two tables of R rows and C columns: when one table is filled the other is emptied and vice versa.

It has to be noted that, as it is known in the art, the same table, or two tables, can be used for both for the interleaving and the deinterleaving.

FIG. 3 shows how symbols of a block are deinterleaved in a method of deinterleaving according to the invention. In this example small numbers are chosen as values of R, C and N, to facilitate the illustration of the method according to the invention: R=16, C=3, and N=4.

A block of symbols 30, consisting of R×C symbols, that is 48 symbols, is provided to a table 31. In an expanded view of the block of symbols 30 the symbols are numbered from 0 to 47, according to the order with which they are received for example from the demodulator 15', i.e. the number associated to each symbol is the position index i.

According to the scheme of interleaving used, it is required that the symbols of the block of symbols 30 are stored in the buffer memory 22 according to a rearranged order, i.e. the original order prior to interleaving, so that each symbol has a new position index i, such that i=c×R+r, with r=j DIV C and c=j MOD C. In the Figure it is shown how the symbols of the block of symbols 30, identified by their initial position index j, appear according to the rearranged order in the buffer memory 22. The buffer memory 22 consists of an array of entries, each capable of accommodating M=4 symbols; the entries are the smallest units of the buffer memory that can be addressed with the highest efficiency, which buffer memory typically consists of an SDRAM type.

While according to the prior art a table of 16 rows×3 columns would be used to accomplish the required rearrangement, according to the invention a table 31 of N rows×3 columns is used, with N smaller than 16. In this example N is equal to 4: this is the natural choice for N is 4, since M=4.

The rearrangement is accomplished as explained below.

In a first step a first sub-block 32 of N×C symbols, that is 12 symbols, of the block of symbols 30 is stored in the table 31 in a row by row order, that is first the $0^{th}$ row, and subsequently the $1^{st}$ row, the $2^{nd}$ row and the $3^{rd}$ row; after having been completely filled, the table 31 is read in a column by column order, that is first the $0^{th}$ column, and subsequently the $1^{st}$ column, and the $2^{nd}$ column; the groups of N, in this case 4, symbols read from each column are stored in the buffer memory 22, at locations having a distance of R symbols from one another, so as to leave a gap for R-N, in this case 12, symbols between a group and another. Therefore the groups of 4 symbols read from each column are stored in the buffer memory 22 for example in the entries n, n+4 and n+8.

In a second step, a second sub-block 33 of N×C symbols are stored in the table 31 in a row by row order; then the table 31 is read in a column by column order, the groups of N symbols read from each column are stored in the buffer memory 22, at subsequent locations in respect with the groups of N symbols of the first sub-block, that is in the entries n+1, n+5 and n+9.

In subsequent steps, a third sub-block 34, and a fourth and last sub-block 35 are dealt with similarly so as to obtain the entire block of symbols 30 reordered in the buffer memory 22.

To handle a continuous flow of symbols from the demodulator, the alternate use of two tables of N rows and C columns can be foreseen: when one table is filled the other is emptied and vice versa.

FIG. 4 shows a schematic view of a device for deinterleaving or deinterleaver according to the invention.

The deinterleaver 17' is connected to a buffer memory 22 and comprises:

a table 31 of N rows and C columns, a front-end logic unit 40 for storing sub-blocks of N×C symbols of the block in the table 31 in a row by row order, and a rearrangement logic unit 41 for fetching in a column by column order groups of N symbols from in the columns of the table 31, and storing them in the buffer memory 22, so that they appear in the buffer memory 22 according to the rearranged order.

Such a device is preferably implemented as an Integrated Circuit or as a part of an Integrated Circuit responsible for the whole decoding, that is comprising also the demodulation and error correction.

Such a device can be comprised in an apparatus for accessing an information carrier 13.

Further, such a deinterleaver, and the corresponding interleaver can be implemented as integral and sharing the same resources, particularly the same table or tables. The rearrangement logic can be implemented as a combination of wired logic and IC firmware and/or software. The front-end logic is preferably implemented with wired logic only.

It has to be outlined that as table 31 it is essentially intended a bi-dimensional memory structure, wherein each element of the table is identified by two indexes. It is absolutely irrelevant which of the two indexes is associated to the rows and which is associated to the columns: therefore the methods and devices according to the invention can also be described by swapping the references to rows and columns.

Similarly, it is also irrelevant the order with which elements of a row are written, and the order with which elements of a column are read. In other words the scheme of interleaving can always be modified to include a permutation of the rows and/or the columns.

FIG. 5 shows an ECC cluster, according to the BD standard. The ECC cluster consists of 248×304 bytes, and can be represented as a table of 248 rows×304 columns. The first 216 rows contain data bytes whereas the remaining 32 rows contain parity bytes. The ECC cluster comprises 32 Data Frames 50 of 2052 bytes each, that is nine and a half columns each. The data frames 50 are the data structures used by an application running on a host device 24.

For such a block of bytes, received as part of a continuously incoming stream of bytes, the deinterleaving according to the prior art would require the use of two tables of 248×304 bytes.

In an embodiment of the method according to the invention, N is selected equal to 16: this implies the use of two tables of 16×304 bytes instead, allowing for a reduction of the memory size by a factor 15 approximately. The value 16 for N is the most natural choice if the buffer memory 22 has entries of M=16 bytes each.

This corresponds to process sub-blocks of 16 rows×304 columns, which can be visualized in the figure as groups of subsequent 16 rows 51.

As it has been already anticipated, it would be possible to use even smaller values for N, like 8 or 4, allowing a further reduction of the memory size, but resulting in an increasing strain on the rearrangement logic unit and/or in a loss in bandwidth. The use of values for N not being dividers of M is considered unpractical.

Since in this case N, that is 16, is not a divider of R, that is 248, the last sub-block fills incompletely the table, that is only 8 rows: care has to be taken when transferring the content of the rows to the buffer memory 22. Preferably this situation can be handled by copying the entire rows in adequate entries of the buffer memory 22, allowing for the presence of 8 non-meaningful or dummy bytes to be copied in the buffer memory 22. An application residing on the host device 24 needs to be adapted to ignore said dummy bytes when accessing the deinterleaved bytes in the buffer memory.

Further, the method according to the invention can be applied for the storage in the buffer memory of the 216 rows of data bytes only, while 32 rows of parity byte can be stored in a different memory or can be handled directly for the error correction.

In a further embodiment of the method of deinterleaving according to the invention, the deinterleaving of symbols received as part of a continuously incoming stream of symbols is accomplished with a single table. In general, in this further embodiment of the method according to the invention it is foreseen that:

the N rows of the table are partitioned into $P_N$ groups, the C columns of the table are assigned to $P_C$ groups, in the step of storing symbols in the table in a row by row order, the incoming symbols are stored in the table like in a circular buffer, that is after having filled the last row, the first row is filled again, in the step of fetching symbols stored in the table in a column by column order, the stored symbols are fetched from the table like from a circular buffer, that is after having read the last column, the first column is read again, after a group of rows has been filled, a corresponding group of columns, and, possibly, the columns subsequent to the columns of the corresponding group of columns are read, entirely or partly, and the symbols fetched are stored at locations so that the symbols appear in the buffer memory in the rearranged order.

This further embodiment is explained with reference to FIGS. 6a, 6b and 6c. In this particular example:

R=16,

N=8,

C=6,

M, the number of symbols per entry of the buffer memory 22, is also 8, $P_N$ and $P_C$=2, the columns of the first group are columns 0, 1 and 2, the columns of the second group are columns 3, 4 and 5, the rows of the first group are rows 0, 1, 2 and 3, the rows of the second group are rows 4, 5, 6 and 7.

In a first step, the first group of rows is written; subsequently the first group of columns is read and the content is transferred to the buffer memory 22. The situation after completion of the first step is shown in FIG. 6a. In the table 31 the barred symbols are to indicate symbols that have been copied to the buffer memory 22 at the time when the first step is completed.

In a second step, the second group of rows is written; subsequently the second group of columns is read and the content is transferred to the buffer memory 22. The situation after completion of the second step is shown in FIG. 6b. In the table 31 the barred symbols are to indicate symbols that have been copied to the buffer memory 22 at the time when the second step is completed.

In a third step, since the table has been completely filled in the previous step, the first group of rows is overwritten, subsequently the first group of columns is read and the content is transferred to the buffer memory 22. The situation after completion of the third step is shown in FIG. 6c.

It is clear how the method is continued to obtain the deinterleaving of a block and various subsequent blocks. In the third step the access to the buffer memory 22 has been less efficient since entries of the buffer memory have been written only partly and groups of N symbols have been written in some cases across two entries. This loss in efficiency however can be accepted in certain situations if compared to the benefit of further reduction in memory size.

The embodiment of the method of deinterleaving according to the invention, explained with reference to FIGS. 6a, 6b and 6c can be advantageously applied and adapted to the case of N not being a divider of R, as it is explained with reference to FIGS. 7a to 7k. In this example:

R=10,

C=4,

M, the number of symbols per entry of the buffer memory 22, is also 4,

N=4, in addition to the table of N×C, an extension table of S×C is used, where S is smaller than N, the extension table being juxtaposed to the table, in this case with S=2, $P_N$=2

$P_C$=2, the columns of the first group are columns 1 and 3, the columns of the second group are columns 0 and 2, the rows of the first group are rows 0, and 1, the rows of the second group are rows 2, and 3, the rows of the extension table form a third group of rows, and are herein labeled as rows 4 and 5.

Figures 7A, 7B:
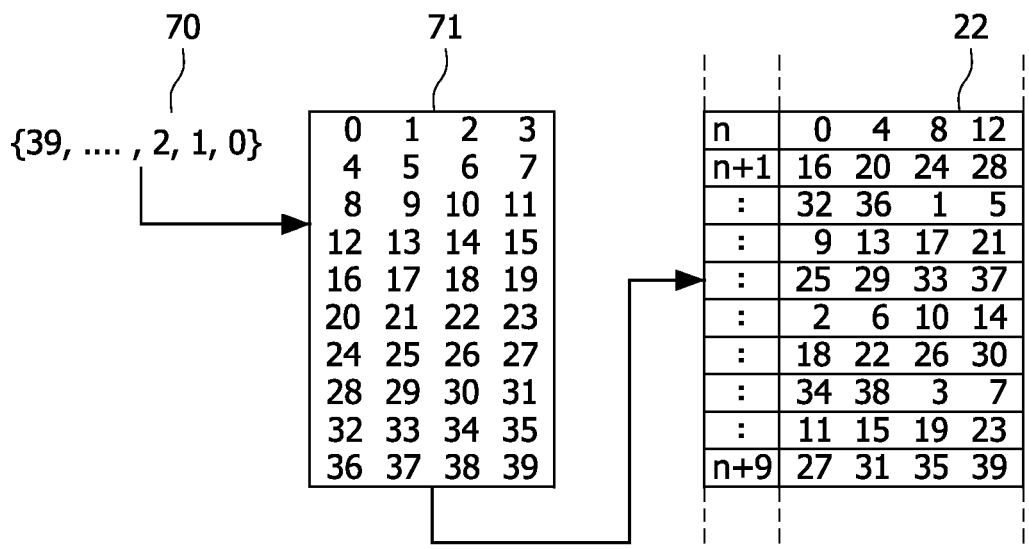

What is desired is to achieve the deinterleaving of a sequence of R×C, that is 40, symbols, as if a "full-scale" table of R rows by C columns was used. FIG. 7a shows the sequence of 40 symbols 70, the full-scale table 71 of 10 rows by 4 columns to be used for deinterleaving, and a buffer memory 22 where the symbols are stored in the deinterleaved order.

In this embodiment instead, a table 72 of (N+S)×C, that is 6 rows×4 columns is used.

Figure 7C:
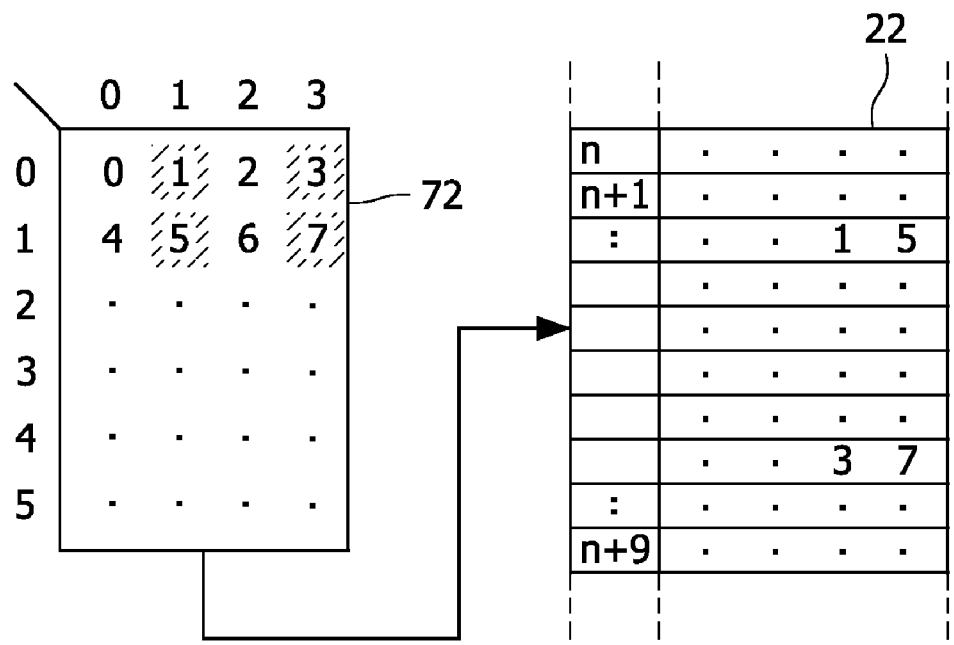

In a first step, the first group of rows is written, bringing the table 72 in the situation shown in FIG. 7b. Subsequently the symbols present in rows 0 and 1 of the first group of columns are read and transferred to the buffer memory 22: the situation after completion of the first step is shown in FIG. 7c, where the barred symbols in the table 72 are to indicate symbols that have been copied to the buffer memory 22.

Figure 7D:
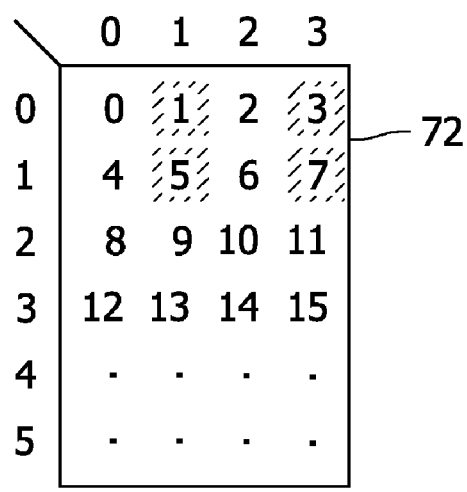
Figure 7E:
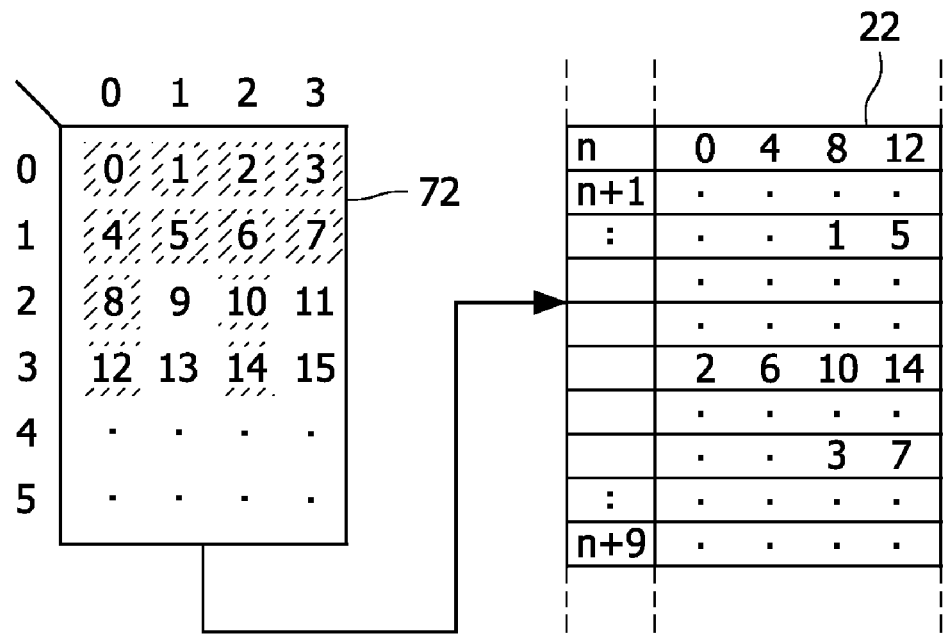

In a second step, the second group of rows is written, bringing the table 72 in the situation shown in FIG. 7d. Subsequently the symbols present in rows 0 to 3 of the second group of columns are read and transferred to the buffer memory 22: the situation after completion of the second step is shown in FIG. 7e.

Figure 7F:
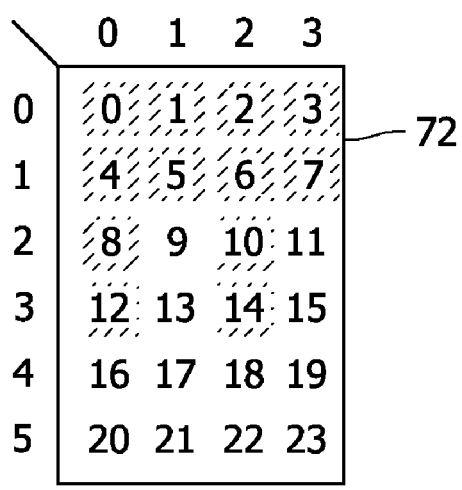
Figure 7G:
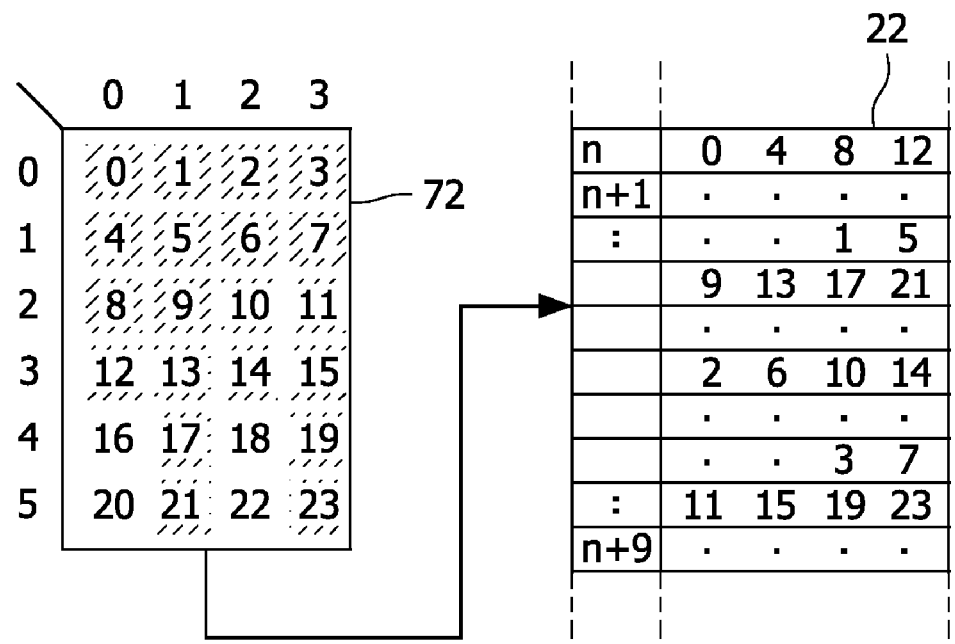

In a third step, rows 4 and 5 are written, bringing the table 72 in the situation shown in FIG. 7f. Subsequently the symbols present in rows 2 to 5 of the first group of columns are read and transferred to the buffer memory 22: the situation after completion of the third step is shown in FIG. 7g.

Figure 7H:
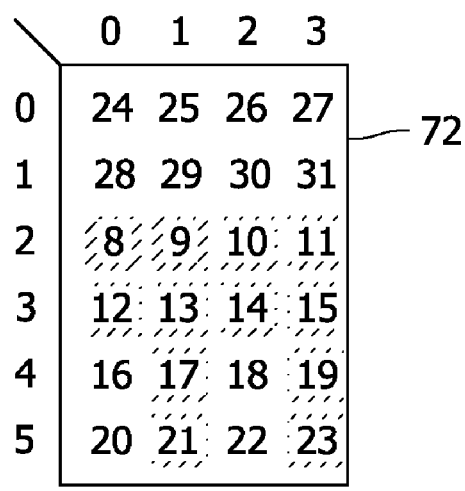
Figure 7I:
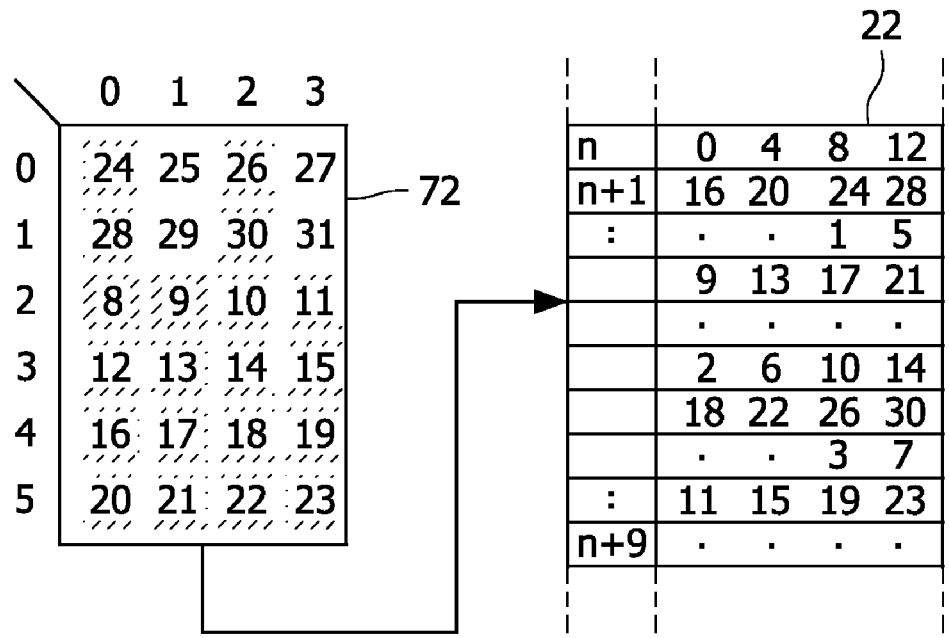

In a fourth step, since the table 72 has been completely filled in the previous step, the first group of rows is overwritten, bringing the table 72 in the situation shown in FIG. 7h. Subsequently the symbols present in rows 4, 5, 0 and 1 of the second group of columns are read and transferred to the buffer memory 22: the situation after completion of the fourth step is shown in FIG. 7i.

Figure 7J:
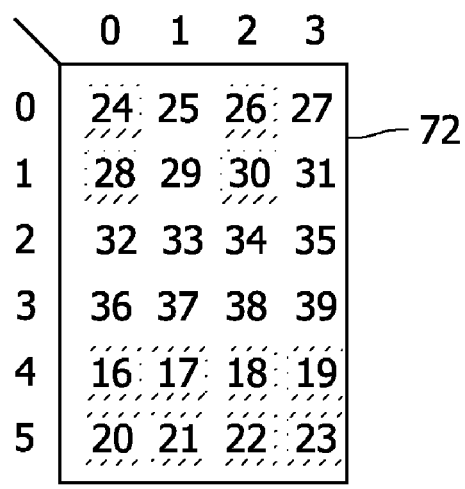
Figure 7K:
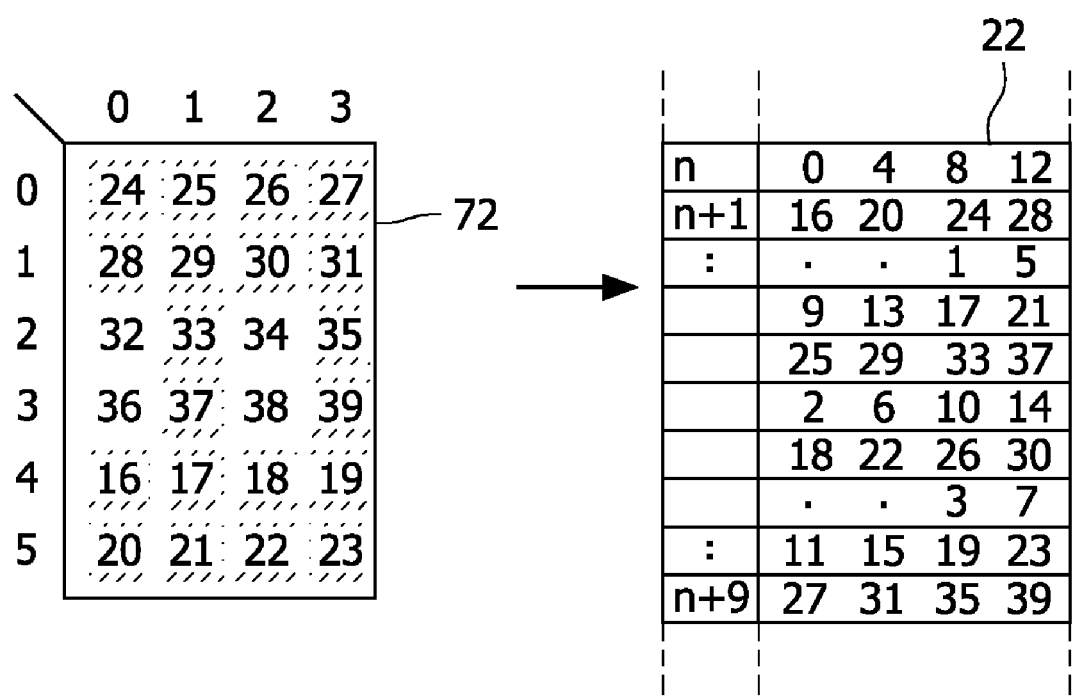

In a fifth step, the second group of rows is written, bringing the table 72 in the situation shown in FIG. 7j. Subsequently the symbols present in rows 0 to 3 of the first group of columns are read and transferred to the buffer memory 22: the situation after completion of the fifth step is shown in FIG. 7k.

In a sixth and conclusive step, the symbols present in rows 2 and 3 of the second group of columns are read and transferred to the buffer memory 22, thereby accomplishing the desired deinterleaving as shown in FIG. 7a.

In this embodiment an extension table has been used to facilitate the fetching of groups of 4 symbols, however it has to be outlined that the use of an extension table can be dispensed with.

When an extension table is used, then S can advantageously be chosen as $N/P_N$, or a multiple thereof.

The advantages of this embodiment are:

the entries of the buffer memory 22 are written at once, thus with the best efficiency, except at the beginning and at the end of the sequence, no dummy bytes need to be foreseen in the buffer memory 22, and a single table, in combination with the extension table is used, instead of two tables.

This has been made possible by the use of the extension table and by an adequate definition of the groups of columns together with the choice of the groups on N symbols transferred at each step from a group of columns, so that groups of N symbols are transferred to a single entry of the memory buffer.

The embodiment of the method of deinterleaving explained with reference to FIGS. 7a-7k, hereinafter referred to as "improved implementation", can easily be applied for values of the parameters R, C, M, N different from the ones given in the specific example of FIGS. 7a-7k. In particular, it can be applied for deinterleaving the ECC cluster shown in FIG. 5, where R=216, leaving aside the parity byte which are dealt with separately, and C=304, the buffer memory 22 having entries of M=16 bytes each.

As it has been introduced above a sensible choice for N is N=M=16, which is not a divider of 216.

In applying this improved method of deinterleaving the following choices are made:

in addition to the table of N×C, an extension table of S×C is used, where S=4, $P_N=4$, $P_C=4$, the rows of the first group are rows 0 to 3, the rows of the second group are rows 4 to 7, the rows of the third group are rows 8 to 11, the rows of the fourth group are rows 12 to 15, the rows of the extension table form a fifth group and are herein labeled rows 16 to 19, the columns of the first group, named group A, are all columns for which column_nr MOD 19 is equal to 10, 12, 14, 16, 18, column_nr being the column index, varying between 0 and 303, the columns of the second group, named group B, are all columns for which column_nr MOD 19 is equal to 1, 3, 5, 7, 9* the columns of the third group, named group C, are all columns for which column_nr MOD 19 is equal to 9*, 11, 13, 15, 17 the columns of the fourth group, named group D, are all columns for which column_nr MOD 19 is equal to 0, 2, 4, 6, 8

It is observed that the columns for which column_nr MOD 19=9 are part of both the groups B and C. These columns will be treated as columns B for rows till 108, and as columns C thereafter.

In FIG. 8, an ECC cluster is shown, where columns are marked as A, B, C or D, according to the group to which they belong.

As already explained with reference to FIGS. 7a-7k, the groups of bytes fetched from columns of the same group are aligned, i.e. taken from the same rows, but the groups of bytes fetched from columns of different groups are shifted in respect with each other. This shift is what actually allows to further reduce the SRAM memory used and to dispense with use of dummy bytes, and avoid the consequent generation of holes in the buffer memory. The shift corresponds to 4 rows, since $N/P_N=4$.

While processing the beginning and the end of the ECC cluster, groups of bytes fetched will be smaller than 16, namely 4, 8 and 12. Yet, this does not give rise to holes in the buffer memory since the groups of 4, 8 and 12 bytes at the beginning of the ECC cluster are complementary to the groups of 12, 8 and 4 bytes at the end of the data cluster.

Bytes flow from the disc and are stored row by row in the table, and are read from the table and sent to the buffer memory as soon as subsequent groups of rows have been filed. The deinterleaving of the ECC cluster takes place as detailed below.

The first four rows, rows 0-3, at the beginning of the cluster are stored in rows 0-3 in the table; then the bytes in these four rows of the table that belong to column subset A are read column by column from the table and sent to the memory buffer, where they are stored in the adequate locations, i.e. according to the deinterleaved order to be achieved. Since these groups only comprise 4 bytes, instead of 16, some extra dummy bytes are added, like any other time a group smaller that 16 bytes is transferred to the memory buffer. These dummy bytes however are not effectively written to the buffer: a mask can be used to prevent that they are written to the buffer.

Then the next four rows of the ECC cluster, rows 4-7, are stored in rows 4-7 of the table; then the bytes in rows 0-8 of the table that belong to column subset B are transferred to the memory buffer.

Then the next four rows of the ECC cluster, rows 8-11, are stored in rows 8-11 of the table; then the bytes in rows 0-11 of the table that belong to column subset C are transferred to the memory buffer.

Then the next four rows of the ECC cluster, rows 12-15, are stored in rows 12-15 of the table; then the bytes in rows 0-15 of the table that belong to column subset D are transferred to the memory buffer. These groups comprise exactly 16 bytes, and are effectively put in one entry of the buffer memory.

Then the next four rows, rows 16-19, of the ECC cluster are stored in rows 16-19 of the table; then the bytes in rows 4-19 of the table that belong to column subset A are transferred to the memory buffer. These groups comprise exactly 16 bytes, and are effectively put in one entry of the buffer memory.

In order to handle the incoming stream of symbols, fetching symbols from a group of columns, corresponding to a group or rows already written, takes place at the same time when the subsequent group of rows is written. For example while the bytes in rows 0-15 of the table that belong to column subset D are fetched from the table, rows 16-19 of the table are being filled.

Then the next four rows, rows 20-23, of the cluster are stored in rows 0-3 of the table; then the bytes in rows 8-19, 0-3 of the table that belong to column subset B are transferred to the memory buffer. These groups comprise exactly 16 bytes, and are effectively put in one entry of the buffer memory.

Then the next four rows, rows 24-27, of the cluster are stored in rows 4-7 of the table; then the bytes in rows 12-19, 0-7 of the table that belong to column subset C are transferred to the memory buffer. These groups comprise exactly 16 bytes, and are effectively put in one entry of the buffer memory.

This process is similarly continued.

When rows 104-107 of the ECC cluster are stored in the table, the 4 EDC bytes of the 16 even dataframes can be transferred to the buffer or alternatively to some intermediate memory. This may give rise to holes of 12 dummy bytes at the end of a dataframe in the buffer, which can anyway be used for status information of the dataframe.

After rows 116-119 of the ECC cluster are stored in the table, and the relevant bytes, corresponding to rows 104 to 119 of the ECC cluster, that belong to column subset B are transferred to the buffer memory, the columns with column_nr MOD 19=9 are considered columns of the group C.

When rows 120-123 of the ECC cluster are stored in the table, then the relevant bytes, corresponding to rows 108 to 123 of the ECC cluster, that belong to column subset C are transferred to the buffer memory.

When rows 124-127 of the ECC cluster are stored in the table, then the relevant bytes, corresponding to rows 112 to 127 of the ECC cluster, that belong to column subset D are transferred to the buffer memory.

This process is repeated until the row 215, when the bytes of column subset B, corresponding to rows 200 to 215 of the ECC cluster, are transferred to the buffer memory.

This operation can easily be extended to the 32 rows of the parity bytes for syndrome calculation or any other reason.

All the remaining bytes of the ECC cluster are at this point in the table and can be transferred to the buffer memory: first the groups of 12 bytes in columns of the group C, then the groups of 8 bytes in columns of the group D, last the groups of 4 bytes in columns of the group A.

From these last groups the data bytes that are located in columns with column_nr MOD 19=18 are the EDC bytes of the odd dataframes. They can be transferred to the SDRAM-buffer or alternatively be transferred in some intermediate memory.

It can be noted that an ECC cluster according to BD contains as substructures 32 dataframes of 2052 bytes which is not a multiple of M=16. The method presented hereinabove achieves that byte 0 of the odd dataframes is the first in a group of N bytes transferred, and is nicely aligned with the entries, so that no dummy bytes or wholes at the beginning of a dataframe in the buffer are generated.

In a variation of this method the extension table can contain 5 rows instead of 4 to facilitate the synchronization of storing bytes in the table and fetching bytes from the table. This additional row can be used for storing some incoming bytes when the locations where the incoming bytes should be stored have not been freed yet. A possible way to use this additional row is that the whole table is indeed used as a circular buffer as far as rows are concerned. In this case, fixed groups of rows no longer exists, or in other words rows are dynamically allocated to the various groups of rows: that is a subsequent group of rows always consists of the 4 (=N/$P_N$) rows further than the current group of rows, so first group of rows 0-3, next group rows 4-7, next group rows 8-11, next group rows 12-15, next group rows 16-19, next group of rows 20-2, next group of rows 3-6, etc.

As it will appear clear, the underlying idea in this improved method can be similarly applied to the inverse operation of interleaving.

It must further be noted that the term "comprises/comprising" when used in this specification, including the claims, is taken to specify the presence of stated features, integers, steps or components, but does not exclude the presence or addition of one or more other features, integers, steps, components or groups thereof. It must also be noted that the word "a" or "an" preceding an element in a claim does not exclude the presence of a plurality of such elements. Moreover, any reference signs do not limit the scope of the claims; the invention can be implemented by means of both hardware and software, and several "means" may be represented by the same item of hardware. Furthermore, the invention resides in each and every novel feature or combination of features.

The invention can be summarized as follows. Interleaving improves noise rejection in digital communication and storage systems. According a known scheme, the interleaving/deinterleaving is achieved by storing symbols in a temporary memory table of R rows×C columns in a row by row order, and reading them in a column by column order, or vice versa, so obtaining a rearranged order. Methods and devices for interleaving and deinterleaving are proposed which accomplish the same interleaving/deinterleaving operation with a reduced size of the temporary memory table.

The rearrangement of the symbols according to the rearranged order is accomplished by using a table with a reduced memory size, in combination with the order with which the symbols are fetched from or stored in a further memory. The invention further relates to ICs and apparatuses for interleaving and/or deinterleaving.

The invention claimed is:

1. A method of deinterleaving symbols belonging to a block (30) of R×C symbols, R and C being integer, in which block symbols are ordered according to a respective position index i, comprising:

reordering the symbols in a rearranged order, so that the each symbol has a new position index j, such that j=c× R+r, with r=i DIV C and c=i MOD C, and storing the symbols in a buffer memory (22) in the rearranged order, characterized in that the reordering and storing of the symbols is performed by:

using a table (31) of N rows and C columns, N being an integer smaller than R, storing in the table a first sub-block (32) of N×C symbols of the block, in a row by row order, fetching groups of N symbols from the columns of the table, in a column by column order, and storing in the buffer memory (22) the groups of N symbols, at locations having a distance of R symbols from one another.

2. The method as claimed in claim 1, characterized in that the storing in the table (31) of the symbols in a row by row order, the fetching of the groups of N symbols in a column by column order, and the storing in the buffer memory (22) of the groups of N symbols, are applied to subsequent sub-blocks (33, 34, 35) of N×C symbols as many times as necessary to the exhaustion of the block (30), each time the groups of N symbols present in each column being stored in the buffer memory at subsequent locations in respect with the groups of N symbols stored the previous time.

3. The method as claimed in claim 1, wherein the block (30) is received as part of a continuously incoming stream of symbols.

4. The method as claimed in claim 3, characterized in that an additional table of N rows and C columns is used, and alternatively while symbols being received are stored in the table (31), symbols present in the additional table are fetched and stored in the buffer memory (22), and while symbols present in the table are fetched, symbols being received are stored in the additional table.

5. Method as claimed in claim 3, characterized in that:
the N rows of the table are partitioned into $P_N$ groups,
the C columns of the table are partitioned into $P_C$ groups,
in the step of storing symbols in the table (31) in a row by row order, the incoming symbols are stored in the table like in a circular buffer,
in the step of fetching symbols stored in the table in a column by column order, the stored symbols are fetched from the table like from a circular buffer, and
after a group of rows has been filled, a corresponding group of columns is read, and
the $P_N$ groups of symbols fetched from each columns are stored at locations so that the symbols appear in the buffer memory (22) in the rearranged order.

6. The method as claimed in claim 1, further comprising the step of effecting a permutation of the columns and/or of the rows of the table (31) before the step of fetching symbols from the table.

7. A method of interleaving symbols belonging to a block (30) of R×C symbols, R and C being integer, in which block symbols are ordered according to a respective position index j, the block being stored in a buffer memory (22), comprising the steps of
fetching the symbols from the buffer memory, and
reordering the symbols in a rearranged order, so that the each symbol has a new position index i, where i=r×C+c, with c=j DIV R and r=j MOD R,
characterized in that the fetching and reordering of the symbols is performed by:
using a table (31) of N rows and C columns, N being an integer smaller than R,
fetching from the buffer memory C groups of N symbols, at locations having a distance of R symbols from one another,
storing in the table the C groups of N symbols, in a column by column order, and
fetching the symbols from the table in a row by row order so as to have a first sub-block (32) of N×C symbols of the block reordered according to the re-arranged order.

8. The method as claimed in claim 7, characterized in that the fetching of the groups of N symbols from the buffer memory (22),
the storing in a column by column order of the groups of N symbols, and
the fetching of the symbols from the table in a row by row order, are applied so as to form subsequent sub-blocks (33, 34, 35) of N×C symbols as many times as necessary to reorder the block (30), each time the C groups of N symbols being fetched from the buffer memory at subsequent location in respect with the C groups of N symbols fetched the previous time.

9. The method as claimed in claim 7, wherein the block (30) in the re-arranged order is transmitted as part of a continuously outgoing stream of symbols.

10. A deinterleaver (17') for deinterleaving symbols belonging to a block (30) of R×C symbols, R and C being integer, in which block symbols are ordered according to a respective position index i, the deinterleaver being connected to a buffer memory (22), and being capable of storing the symbols in the buffer memory in a rearranged order, so that the each symbol has a new position index j, such that j=c×R+r, with r=i DIV C and c=i MOD C, characterized by comprising:|
a table (31) of N rows and C columns, N being an integer smaller than R,
a front-end logic unit (40) for storing symbols of the block in the table in a row by row order, and
a rearrangement logic unit (41) for fetching in a column by column order groups of N symbols from in the columns of the table, and storing them in the buffer memory, at locations having a distance of R symbols from one another.

11. The deinterleaver (17') as claimed in claim 10, characterized in that the front-end logic unit (40) is configured for receiving the block (30) is as part of a continuously incoming stream of symbols.

12. An Integrated Circuit comprising a deinterleaver (17') as claimed in claim 10.

13. A receiver (12) comprising a deinterleaver (17') as claimed in claim 10.

14. An interleaver (17) for interleaving symbols belonging to a block (30) of R×C symbols, R and C being integer, in which block symbols are ordered according to a respective position index j, the block being stored in a buffer memory (22) connected to the interleaver, the interleaver being capable of fetching the symbols from the buffer memory and rearranging them in a rearranged order, so that the each symbol has a new position index i, such that i=c×R+r, with r=j DIV C and c=j MOD C, characterized by comprising:
a table (31) of N rows and C columns, N being an integer smaller than R,
a rearrangement logic unit (41) for fetching groups of N symbols from the buffer memory, at locations having a distance of R symbols from one another, and storing them in the columns of the table in a column by column order symbols, and
a front-end logic unit (40) for fetching symbols from in the table in a row by row order.

15. The interleaver (17) as claimed in claim 14, characterized in that the front-end logic unit (40) is configured for transmitting the block (30) is as part of a continuously outgoing stream of symbols.

16. A transmitter (11) comprising an interleaver (17) as claimed in claim 14.

* * * * *